United States Patent
So et al.

(10) Patent No.: US 8,598,573 B1
(45) Date of Patent: Dec. 3, 2013

(54) INFRARED PASS VISIBLE BLOCKER FOR UPCONVERSION DEVICES

(75) Inventors: Franky So, Gainesville, FL (US); Do Young Kim, Gainesville, FL (US); Bhabendra Pradhan, Marietta, GA (US)

(73) Assignees: University of Florida Research Foundation, Inc., Gainesville, FL (US); Nanoholdings, LLC, Rowayton, CT (US)

( * ) Notice: Subject to any disclaimer, the term of this patent is extended or adjusted under 35 U.S.C. 154(b) by 62 days.

(21) Appl. No.: 13/272,886

(22) Filed: Oct. 13, 2011

Related U.S. Application Data

(60) Provisional application No. 61/447,415, filed on Feb. 28, 2011.

(51) Int. Cl.
*H01L 29/08* (2006.01)
*H01L 27/15* (2006.01)
*H01L 21/00* (2006.01)
*H05B 33/00* (2006.01)

(52) U.S. Cl.
USPC ............ 257/40; 257/79; 438/22; 250/484.2

(58) Field of Classification Search
USPC .................. 257/40, 79; 438/22; 250/484.2
See application file for complete search history.

(56) References Cited

U.S. PATENT DOCUMENTS

| | | | | |
|---|---|---|---|---|
| 3,800,156 A | * | 3/1974 | Kohashi et al. | 250/330 |
| 5,339,198 A | * | 8/1994 | Wheatly et al. | 359/359 |
| 5,438,198 A | * | 8/1995 | Ebitani et al. | 250/330 |
| 6,281,151 B1 | * | 8/2001 | Tick | 501/3 |
| 2003/0230980 A1 | * | 12/2003 | Forrest et al. | 313/600 |
| 2004/0031965 A1 | * | 2/2004 | Forrest et al. | 257/79 |
| 2005/0236556 A1 | * | 10/2005 | Sargent et al. | 250/214.1 |
| 2006/0198025 A1 | * | 9/2006 | Chen | 359/588 |
| 2006/0290270 A1 | * | 12/2006 | Kim et al. | 313/503 |
| 2010/0181552 A1 | * | 7/2010 | So | 257/21 |
| 2010/0237247 A1 | | 9/2010 | Chen | |
| 2011/0032461 A1 | * | 2/2011 | Cho et al. | 349/116 |

FOREIGN PATENT DOCUMENTS

| | | |
|---|---|---|
| EP | 0632507 A2 | 1/1995 |
| JP | 2001-339099 | 12/2001 |
| KR | 2010-0018851 | 2/2010 |
| WO | WO 2010-085412 A2 | 7/2010 |

\* cited by examiner

*Primary Examiner* — Long K Tran
*Assistant Examiner* — Dzung Tran
(74) *Attorney, Agent, or Firm* — Wolf, Greenfield & Sacks, P.C.

(57) ABSTRACT

An IR-to-Visible up-conversion device with a stacked layer structure includes an IR pass visible blocking layer such that the IR entry face of the stacked device allows IR radiation, particularly NIR radiation, to enter the device but visible light generated by a light emitting diode (LED) layer to be blocked from exit at that IR entry face of the device. The device has an IR transparent electrode at the IR entry face and a visible light transparent electrode such that the visible light can exit the device at a visible light detection face opposite the IR entry face.

14 Claims, 2 Drawing Sheets

__US 8,598,573 B1__

INFRARED PASS VISIBLE BLOCKER FOR UPCONVERSION DEVICES

CROSS-REFERENCE TO RELATED APPLICATION

The present application claims the benefit of U.S. Provisional Application Ser. No. 61/447,415, filed Feb. 28, 2011, which is hereby incorporated by reference herein in its entirety, including any figures, tables, or drawings.

BACKGROUND OF INVENTION

Infrared (IR)-to-visible light up-conversion devices have attracted a great deal of interest due to the potential application in night vision, range finding, and security as well as semiconductor wafer inspections. IR-to-visible light up-conversion devices have been constructed by integrating a photodetector with a light-emitting diode (LED) or an organic light-emitting diode (OLED). However, for some applications, such as a night vision device, the up-conversion device can be unsuitable if the visible light can pass through the IR transparent electrode through which IR radiation enters. Hence, there is a need for an up-conversion device for many applications, such as night vision applications, where stacked active layers of the device are perpendicular to the IR light input and includes a layer that has a means to restrict the visible light output to exclusively the desired observation site.

BRIEF SUMMARY

Embodiments of the invention are directed to an up-conversion device having a stacked layer structure. The device comprises an IR pass visible blocking layer, an IR entry transparent electrode, an IR sensitizing layer, a light emitting diode (LED) layer, and a visible exit transparent electrode. The IR pass visible blocking layer is situated between an IR radiation source and the LED layer, for example, between the IR radiation source and the IR entry transparent electrode. The IR pass visible blocking layer blocks the passage of visible light, at the wavelength or wavelengths emitted by the LED layer, but allows the passage of NIR radiation to the IR sensitizing layer. The IR pass visible blocking layer can be a composite structure having a multiplicity of two alternating films of materials with different refractive indexes, such as a stack of alternating $Ta_2O_5$ and $SiO_2$ films or LiF and $TeO_2$ films. Alternatively, the IR pass visible blocking layer can comprise one or more films of Si, CdS, InP, and/or CdTe. The IR entry transparent electrode can be Indium tin Oxide (ITO), Indium Zinc Oxide (IZO), Aluminum Tin Oxide (ATO), Aluminum Zinc Oxide (AZO), carbon nanotubes, or silver nanowires and the visible exit transparent electrode can be Indium tin Oxide (ITO), Indium Zinc Oxide (IZO), Aluminum Tin Oxide (ATO), Aluminum Zinc Oxide (AZO), carbon nanotubes, silver nanowires, Mg:Ag, or a Mg:Ag and $Alg_3$ stack layer.

The LED layer comprises an electron transport layer (ETL), a light emitting layer, and a hole transport layer (HTL). The ETL can comprise tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), and tris-(8-hydroxy quinoline) aluminum ($Alq_3$). The light emitting layer can comprise tris-(2-phenylpyidine) iridium, $Ir(ppy)_3$, poly-[2-methoxy, 5-(2'-ethyl-hexyloxy)phenylene vinylene] (MEH-PPV), tris-(8-hydroxy quinoline) aluminum ($Alq_3$), or iridium (III) bis-[(4,6-di-fluorophenyl)-pyridinate-N,C2']picolinate (FIrpic). The HTL can comprise 1,1-bis[(di-4-tolylamino)phenyl]cyclohexane (TAPC), N,N'-diphenyl-N,N'(2-naphthyl)-(1,1'-phenyl)-4,4'-diamine (NPB), and N,N'-diphenyl-N,N'-di(m-tolyl)benzidine (TPD).

DETAILED DISCLOSURE

Figure 1:
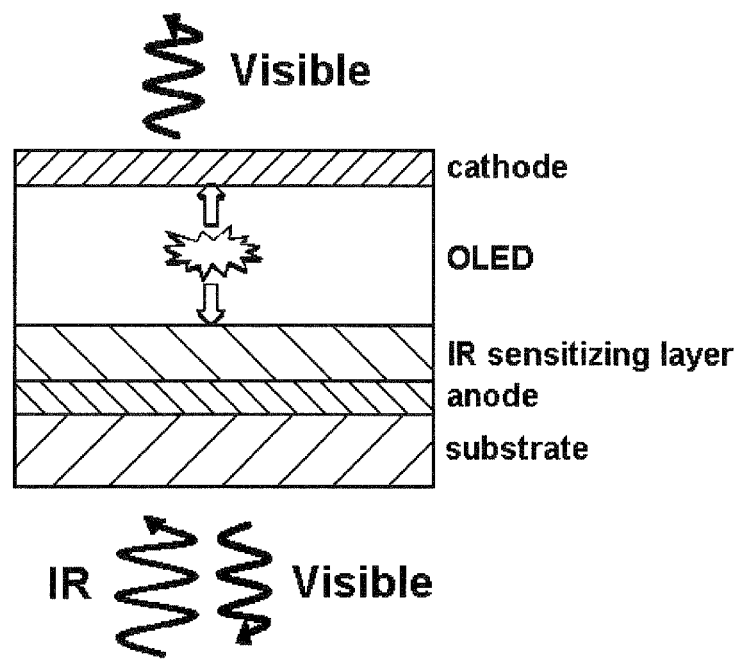
FIG. 1 is a schematic of an IR-to-Visible up-conversion device where transparent electrodes allow visible light to escape at both ends of the stacked layers comprising the up-conversion device.

Embodiments of the invention are directed to IR-to-Visible up-conversion devices, where the output of the visible light generated is restricted from radiating out of the surface from which the IR light enters. In a typical up-conversion device, as shown in FIG. 1, an IR sensitive layer is situated on one side of an electrode, shown as an anode in FIG. 1, where the IR sensitive layer generates a charge carrier, either electron or hole. Under the bias of the device, the charge carrier is directed to a light emitting device (LED) layer, shown as an organic LED (OLED) layer in FIG. 1, where it combines with its complementary charge carrier to generate visible light. The light generated by the LED radiates in all directions from the LED. As shown in FIG. 1 the up-conversion device is constructed with two transparent electrodes where the visible light generated is transmitted through both faces of the device. For some potential applications of up-conversion devices, such as military night vision, it is preferable that the device remain unobserved by visible light detectors, including unwelcomed eyes, other than the intended visible light detector employed with the device. Therefore, it is desirable to block visible light directed in any direction other than to the face where the visible light is intended to be detected, and, particularly, to block light from radiating through the IR entry face. In embodiments of the invention, an IR pass visible blocking layer permits a high proportion of the near IR to enter the device, for example, an IR pass visible blocking layer being at least 50% transmissive in at least a portion of the NIR less than 1.8 μm, and to block transmission of visible light through the IR entry face to the extent that light is not readily detectable over background light.

Figure 2:
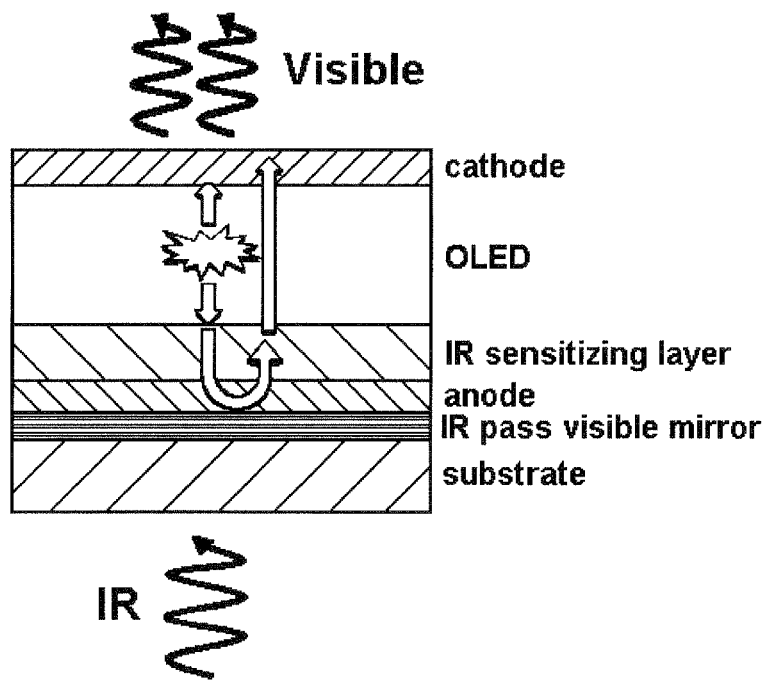
FIG. 2 is a schematic of an IR-to-Visible up-conversion device according to an embodiment of the invention wherein an IR pass visible blocking layer is inserted such that visible light cannot leak from the IR entry face of the device.

The up-conversion device, according to an embodiment of the invention, is shown in FIG. 2, where, by including an IR pass visible blocking layer between the IR entry face and the IR sensitive layer, the device becomes visible light opaque at the IR entry face because the IR pass visible blocking layer absorbs and/or reflects visible light internally rather than allowing visible light loss through the IR entry face. For purposes of the invention, the electrode closest to the IR entry face must be IR transparent to a high degree, at least about 50% transmittance, and the electrode closest to the visible detection face must be visible light transparent to a high degree, at least about 50% transmittance over the wavelength range that visible light is emitted from the LED. When the IR pass visible blocking layer has a reflective surface, an increase in the proportion of visible light directed to the light detection face of the device is possible relative to no layer or a non-reflective IR pass visible blocking layer. The surfaces of the up-conversion device perpendicular to the stacked layers can be covered with an opaque coating or otherwise abutted to an opaque surface that is an absorbent an/or reflective surface such that visible light is not lost to the sides of the device. The position of the IR pass visible blocking layer, as shown in FIG. 2, can be between the substrate and anode. The layer can also be situated on the surface of the substrate opposite the anode, or, when both layers have the appropriate electronic properties to act as an interconnect layer or as an active layer in the device, the IR pass visible blocking layer can be situated between any layers of the device on the IR entry side of the LED employed in the device.

Figure 3:
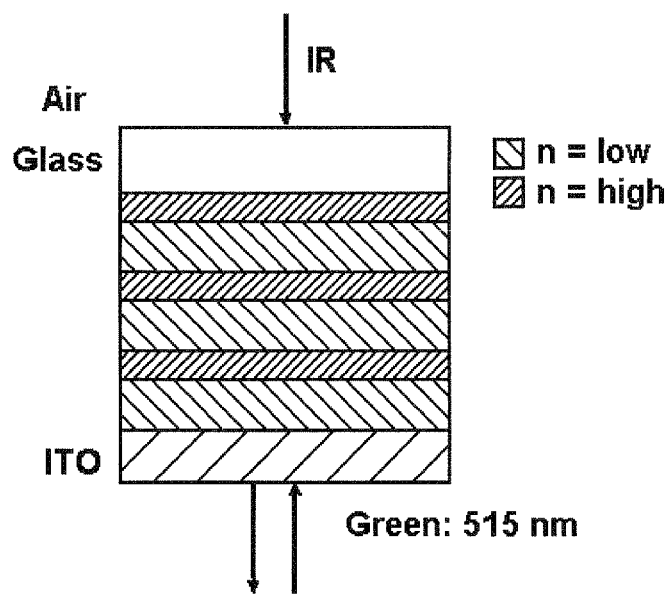
FIG. 3 is a schematic of an IR pass visible blocking layer that is constructed as a composite of alternating films of two materials with different refractive indexes (RIs)

The IR pass visible blocking layer used in the up-conversion device, according to an embodiment of the invention, can employ a multi dielectric stack layer as shown in FIG. 3. The IR pass visible blocking layer uses a stack of dielectric films with alternating films having different refractive indices, where films having high refractive index alternate with films of significantly lower refractive index. In embodiments of the invention, a film is a continuous layer of material, and need not be formed in any particular order or manner. The stack can include films of one or more materials having high refractive indices and film of one or more materials having low refractive indices. In an exemplary IR pass visible blocking layer, the layer is constructed of a composite of alternating $Ta_2O_5$ films (RI=2.1) and $SiO_2$ films (RI=1.45). In other embodiments of the invention other materials can be used, including: a composite of alternating $TiO_2$ films and $SiO_2$ films, and a composite of alternating LiF films and $TeO_2$ films. In other embodiments of the invention, the IR pass visible blocking layer can comprise one or more films that inherently have high IR transparency but are opaque to visible light, for example Si, CdS, InP, or CdTe. As can be appreciated by one skilled in the art, the material or composite material can have some transparency in the visible, however, the material must reflect or absorb the wavelengths of the visible radiation emitted by the LED employed to be effectively opaque to external visible detectors under the ambient light conditions under which the up-conversion device is in use. For some uses of the up-conversion device, the absorption or reflection does not need to be absolute.

In embodiments of the invention, the IR sensitizing layer can be a broad absorption IR sensitizing layer comprising mixed PbSe QDs or mixed PbS QDs. In other embodiments of the invention, the IR sensitizing layer comprises continuous thin films of: PbSe, PbS, InAs, InGaAs, Si, Ge, or GaAs. In embodiments of the invention, the IR sensitizing layer is an organic or organometallic comprising material including, but not limited to: perylene-3,4,9,10-tetracarboxylic-3,4,9,10-dianhydride (PTCDA); tin (II) phthalocyanine (SnPc); SnPc:$C_{60}$, aluminum phthalocyanine chloride (AlPcCl); AlPcCl:$C_{60}$; titanyl phthalocyanine (TiOPc); and TiOPc:$C_{60}$.

In an embodiment of the invention, the LED layer can be an OLED comprising fac-tris(2-phenylpyridine)iridium (Ir(ppy)$_3$) that emits green light at 515 nm. Other LED materials that can be employed in embodiments of the invention include: poly-[2-methoxy, 5-(2'-ethyl-hexyloxy)phenylene vinylene] (MEH-PPV), tris-(8-hydroxy quinoline) aluminum (Alq$_3$), and iridium (III) bis-[(4,6-di-fluorophenyl)-pyridinate-N,C2']picolinate (Flrpic). The LED layer can emit any individual wavelength of light, a mixture of wavelengths, or a narrow or broad spectrum of light. Multiple LED materials can be included in the LED layer and the LED layer can be a plurality of different LED layers.

Transparent electrodes that can be employed at the IR entry transparent electrode, which is shown as the anode in FIG. 2, include Indium tin Oxide (ITO), Indium Zinc Oxide (IZO), Aluminum Tin Oxide (ATO), Aluminum Zinc Oxide (AZO), carbon nanotube films, or silver nanowires. The visible exit transparent electrode, shown as the cathode in FIG. 2, can be Indium tin Oxide (ITO), Indium Zinc Oxide (IZO), Aluminum Tin Oxide (ATO), Aluminum Zinc Oxide (AZO), carbon nanotube, silver nanowire, a Mg:Al layer, or a Mg:Ag and Alq$_a$ stack layer. For example a 10:1 Mg:Ag layer with a thickness of less than 30 nm can be stacked with an Alq$_3$ layer that has a thickness up to 200 nm. The IR entry transparent electrode and/or the visible exit transparent electrode can be formed on substrates that are transparent to the IR spectrum and visible spectrum, respectively, which can be any appropriate glass or polymeric material.

METHODS AND MATERIALS

Figure 4:
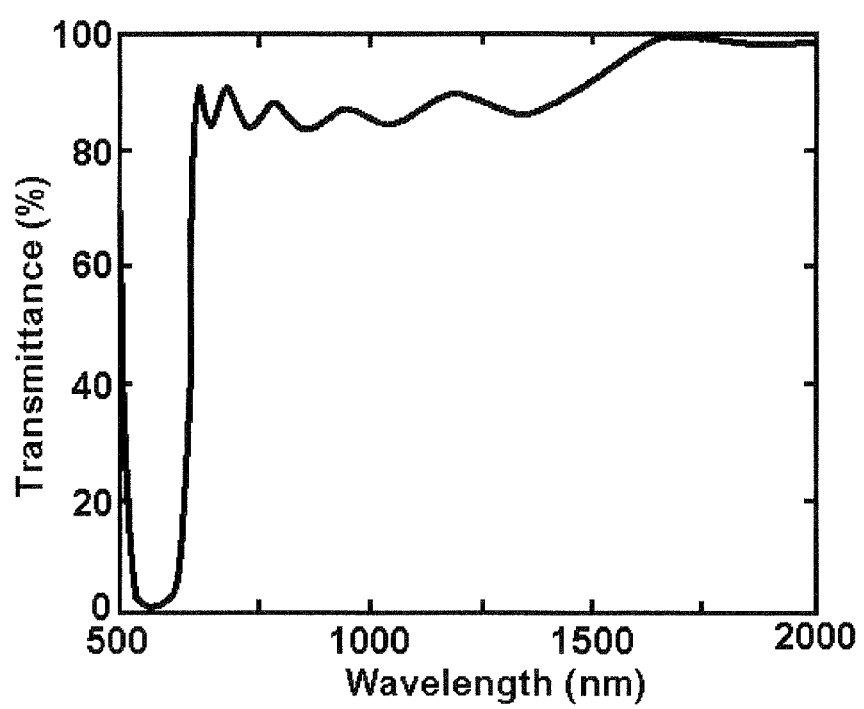
FIG. 4 is a plot of % transmittance as a function of wavelength for the IR pass visible blocking layer of Example 1, which shows high transmittance in the near infrared (NIR) and almost no transmittance in a portion of a visible range, such that the IR pass visible blocking layer can restrict the loss of green light from the IR entry face of an IR-to-Visible up-conversion device according to an embodiment of the invention.

An IR pass visible blocking was constructed of multiple alternating films of $Ta_2O_5$ RI=2.1) and $SiO_2$ (RI=1.45) as indicated in Table 1, below. The IR pass visible blocking had a thickness of about 1 μm and was suitable for use with an up-conversion device using an OLED that emits 515 nm light as it displays a sharp cutoff with almost no transmittance at wavelengths smaller than 575 nm and larger than 450 nm. FIG. 4 shows the transmittance spectrum of the IR pass visible blocking.

TABLE 1

Structure of a multiple layer IR pass visible blocking

| Layer | Material | Thickness in nm |
|---|---|---|
| 1 | $Ta_2O_5$ | 49.0 |
| 2 | $SiO_2$ | 87.3 |
| 3 | $Ta_2O_5$ | 63.2 |
| 4 | $SiO_2$ | 89.9 |
| 5 | $Ta_2O_5$ | 57.9 |
| 6 | $SiO_2$ | 91.9 |
| 7 | $Ta_2O_5$ | 60.1 |
| 8 | $SiO_2$ | 86.2 |
| 9 | $Ta_2O_5$ | 58.7 |
| 10 | $SiO_2$ | 92.0 |
| 11 | $Ta_2O_5$ | 58.3 |
| 12 | $SiO_2$ | 88.2 |
| 13 | $Ta_2O_5$ | 61.3 |
| 14 | $SiO_2$ | 63.8 |
| Total | | 1007.8 |

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. An up-conversion device having a stacked layer structure comprising an IR pass visible blocking layer, an IR entry transparent electrode, an IR sensitizing layer, a light emitting diode (LED) layer, and a visible exit transparent electrode, wherein the IR entry transparent electrode is the anode or the cathode and the visible exit transparent electrode is the cathode or the anode, respectively, wherein under bias, charge carriers generated by the IR sensitizing layer are directed to the LED layer, wherein the IR pass visible blocking layer is situated between an IR radiation source and the LED layer, wherein the IR pass visible blocking layer does not permit passage of visible light at the wavelength emitted by the LED layer but allows passage of NIR radiation to the IR sensitizing layer, and wherein the IR transmittance of the IR pass visible blocking layer is at least 50%.

2. The up-conversion device of claim 1, wherein the IR pass visible blocking layer is a composite structure comprising a multiplicity of two alternating films of materials with different refractive indexes.

3. The up-conversion device of claim 2, wherein the two alternating films comprise a composite of $Ta_2O_5$ and $SiO_2$ or a composite of LiF and $TeO_2$.

4. The up-conversion device of claim 1, wherein the IR pass visible blocking layer comprises one or more films of Si, CdS, InP, and/or CdTe.

5. The up-conversion device of claim 1, wherein the IR entry transparent electrode comprises Indium tin Oxide (ITO), Indium Zinc Oxide (IZO), Aluminum Tin Oxide (ATO), Aluminum Zinc Oxide (AZO), carbon nanotubes, or silver nanowires.

6. The up-conversion device of claim 1, wherein the visible exit transparent electrode comprises: Indium tin Oxide (ITO); Indium Zinc Oxide (IZO); Aluminum Tin Oxide (ATO); Aluminum Zinc Oxide (AZO); carbon nanotubes; silver nanowires; Mg:Ag; or a Mg:Ag and $Alq_3$ stack.

7. The visible exit transparent electrode of claim 6, wherein the Mg:Ag layer has a 10:1 ratio and a thickness of less than 30 nm.

8. The visible exit transparent electrode of claim 6, wherein the $Alq_3$ layer has thickness less than 200 nm.

9. The up-conversion device of claim 1, wherein the LED layer comprises an electron transport layer (ETL), a light emitting layer, and a hole transport layer (HTL).

10. The up-conversion device of claim 9, wherein the ETL comprises tris[3-(3-pyridyl)-mesityl]borane (3TPYMB), 2,9-Dimethyl-4,7-diphenyl-1,10-phenanthroline (BCP), 4,7-diphenyl-1,10-phenanthroline (BPhen), and tris-(8-hydroxy quinoline) aluminum ($Alq_3$).

11. The up-conversion device of claim 9, wherein the light emitting layer comprises tris-(2-phenylpyidine) iridium, $Ir(ppy)_3$, poly-[2-methoxy, 5-(2'-ethyl-hexyloxy)phenylene vinylene] (MEH-PPV), tris-(8-hydroxy quinoline) aluminum ($Alq_3$), or iridium (III) bis-[(4,6-di-fluorophenyl)-pyridinate-N,C2']picolinate (FIrpic).

12. The up-conversion device of claim 9, wherein the HTL comprises 1,1-bis[(di-4-tolylamino)phenyl]cyclohexane (TAPC), N,N'-diphenyl-N,N' (2-naphthyl)-(1,1'-phenyl)-4,4'-diamine (NPB), and N,N'-diphenyl-N,N'-di(m-tolyl)benzidine (TPD).

13. The up-conversion device of claim 1, wherein the IR pass visible blocking layer is situated between an IR radiation source and the IR entry transparent electrode.

14. The up-conversion device of claim 1, wherein the IR sensitizing layer comprises one or more films of perylene-3,4,9,10-tetracarboxylic-3,4,9,10-dianhydride (PCTDA), tin (II) phthalocyanine (SnPc), SnPc:$C_{60}$, aluminum phthalocyanine chloride (AlPcCl), AlPcCl:$C_{60}$, titanyl phthalocyanine (TiOPc), TiOPc:$C_{60}$, PbSe QDs, PbS QDs, PbSe, PbS, InAs, InGaAs, Si, Ge, or GaAs.

* * * * *